United States Patent [19]
Fritz et al.

[11] Patent Number: 5,095,241
[45] Date of Patent: Mar. 10, 1992

[54] COOLING STRUCTURE FOR CATHODE IN ELECTRON BEAM GENERATOR

[75] Inventors: Dieter Fritz, Gelnhausen; Wolfgang Schwarz, Linsengericht, both of Fed. Rep. of Germany

[73] Assignee: PTR Präzisionstechnik GmbH, Maintal/Dörnigheim, Fed. Rep. of Germany

[21] Appl. No.: 579,790

[22] Filed: Sep. 10, 1990

[30] Foreign Application Priority Data

Sep. 12, 1989 [DE] Fed. Rep. of Germany ....... 3930399

[51] Int. Cl.$^5$ .............................. H01J 1/02; H01J 7/26
[52] U.S. Cl. ........................................ 313/35; 313/37; 313/39; 313/46
[58] Field of Search ........................ 313/37, 39, 46, 35

[56] References Cited

U.S. PATENT DOCUMENTS 3,329,849 7/1967 Jones ................................. 313/37 X
3,809,939 5/1974 Miram et al. ...................... 313/46 X Primary Examiner—Palmer C. DeMeo
Attorney, Agent, or Firm—Felfe & Lynch

[57] ABSTRACT

In the electron beam generator cooling is provided by the electrical conductors of the incandescent cathode and control electrode which are configured as heat bridges and connected to cooling plates in the interior of the high-voltage insulator which in turn are connected in a heat-conducting manner to a pot-shaped cooling body. The cooling body, configured as part of a capsule for accommodating circuitry for the control of the electron beam generator, is surrounded by a heat exchanger which is connected to a cooling circuit and is at ground potential, and is insulated from the cooling body by a wall of the high-voltage insulator.

7 Claims, 2 Drawing Sheets

COOLING STRUCTURE FOR CATHODE IN ELECTRON BEAM GENERATOR

BACKGROUND OF THE INVENTION

The invention relates to an electron beam generator, especially for an electron gun, having a high-voltage insulator disposed in a casing and bearing an incandescent cathode and a control electrode, both connectable to a high-voltage terminal.

An electron beam generator of the stated kind is disclosed in DE-OS 33 33 686. In electron beam generators of this kind, the high temperature of the incandescent cathode causes extreme heating of the components adjacent it. In the known electron beam generator excessive heating is prevented by disposing coolant passages in the high-voltage insulator which are made of plastic and are cast in place in the casting resin of the high-voltage insulator. To prevent excessive potential drops, the coolant carried through the coolant passages is transformer oil. In a central recess in the high-voltage insulator above the coolant passages there is a capsule of ferromagnetic material containing circuitry for the rectification and filtration of the Wehnelt voltage and cathode heater current.

From the capsule connecting wires run to the cathode and control electrode disposed below the coolant passages. Empty spaces present within the high-voltage insulator are likewise filled with oil to prevent excessive potential drops and faciliate thermal transfer. These known measures for cooling the electron beam generator have proven to be insufficiently effective. The heat passes from the cathode and the control electrode only over comparatively long distances in the high-voltage insulator into the range of the coolant passages and the thermal transfer from the high-voltage insulator to the coolant oil in the coolant passages is poor. The result is a considerable temperature difference, so that the temperature at the cathode holder and the control electrode can exceed the allowable level. Also the transport of heat through the insulating oil within the beam generator does not become effective until higher temperatures are reached, since the natural convection is unable to transport appreciable amounts of heat until the temperature reaches about 130 degrees C. Lastly, in the known electron beam generators the arrangement of the cooling passages proves to be disadvantageous from the construction point of view because it causes the structural height of the beam head to become greater and the connections for the cathode and the control electrode to become longer.

SUMMARY OF THE INVENTION

The invention is addressed to an electron beam generator having effective cooling even at a low temperature level.

The problem is solved in that the terminals of the cathode holder or additionally the control electrode are connected, by conductors configured as cooling bridges, with cooling plates inside of the high-voltage insulator, and that the cooling plates are in communication by thermal conduction through a thin-walled insulating disk with a cooling body which is cooled by a cooling circuit.

Heat is removed from the cathode and control electrode by components which, on the basis of their material or their geometrical shape, have a high thermal conductivity and are active even at a low temperature gradient. Thus it becomes possible to keep the temperature of the cathode holder and control electrode at a relatively low level, which is very advantageous to the thermal performance of the electron beam generator and for its reliability of operation. Available components, such as the connecting wires, are advantageously used for the thermal transport, so that the cost of construction can be kept low and the overall dimensions of the beam generator can be kept small. While in the case of the connecting wires a good thermal conductivity can be achieved by the choice of the material, e.g., copper or a copper alloy, and by the dimensions of its cross section, the cooling plates attached to the connecting wires permit, due to their relatively great surface area in contact with the insulator disk, an effective transport of heat to the cooling body lying against the other side of the insulating disk.

To achieve a simple construction, provision is also made for the cooling plates to lie in a common plane and be separated from one another by ridges on the high-voltage insulator. The two cooling plates of the cathode terminals and the cooling plate of the anode terminal thus form a single, flat contact surface for the insulator disk and the cooling body situated above it. Provision can furthermore be made in accordance with the invention for the cooling plates to be joined to contacts passing through openings in the insulating disk and in the cooling body and connecting the incandescent cathode and the control electrode to the high-voltage power supply. The cooling plates thus form simultaneously a section of the electrical connection, and by the way they are arranged the designer is given free space for positioning the contacts leading to the high-voltage power supply.

The insulator disk can consist, of a plastic or a ceramic material. It has been found especially advantageous to make the insulator disk from the material known by the trade name, "Kaptan."

The cooling body can consist advantageously of a pot whose flat bottom lies on the insulator disk and through whose side wall the absorbed heat is yielded to a heat exchanger in the cooling circuit. The cooling body itself is likewise characterized by a high thermal conductivity and is preferably made of copper or a copper alloy. A constructional simplification of the electron beam generator can also be brought about by making the pot of the cooling body part of a capsule configured as a Faraday shield in which circuitry is disposed for the control of the electron beam generator.

Provision can also be made for the heat exchanger to reach annularly around the wall of the cooling body inside of the casing, with the heat exchanger at ground potential and separated from the side wall of the cooling body by a wall of the high-voltage insulator. This configuration has the advantage that water can be used in the cooling circuit. The poorer thermal conductivity of the wall of the high-voltage insulator between the cooling body and the heat exchanger is no disadvantage, since a large surface area is available for thermal transfer on account of the large diameter between the side wall of the cooling body and the heat exchanger.

DESCRIPTION OF PREFERRED EMBODIMENT

Figure 1:
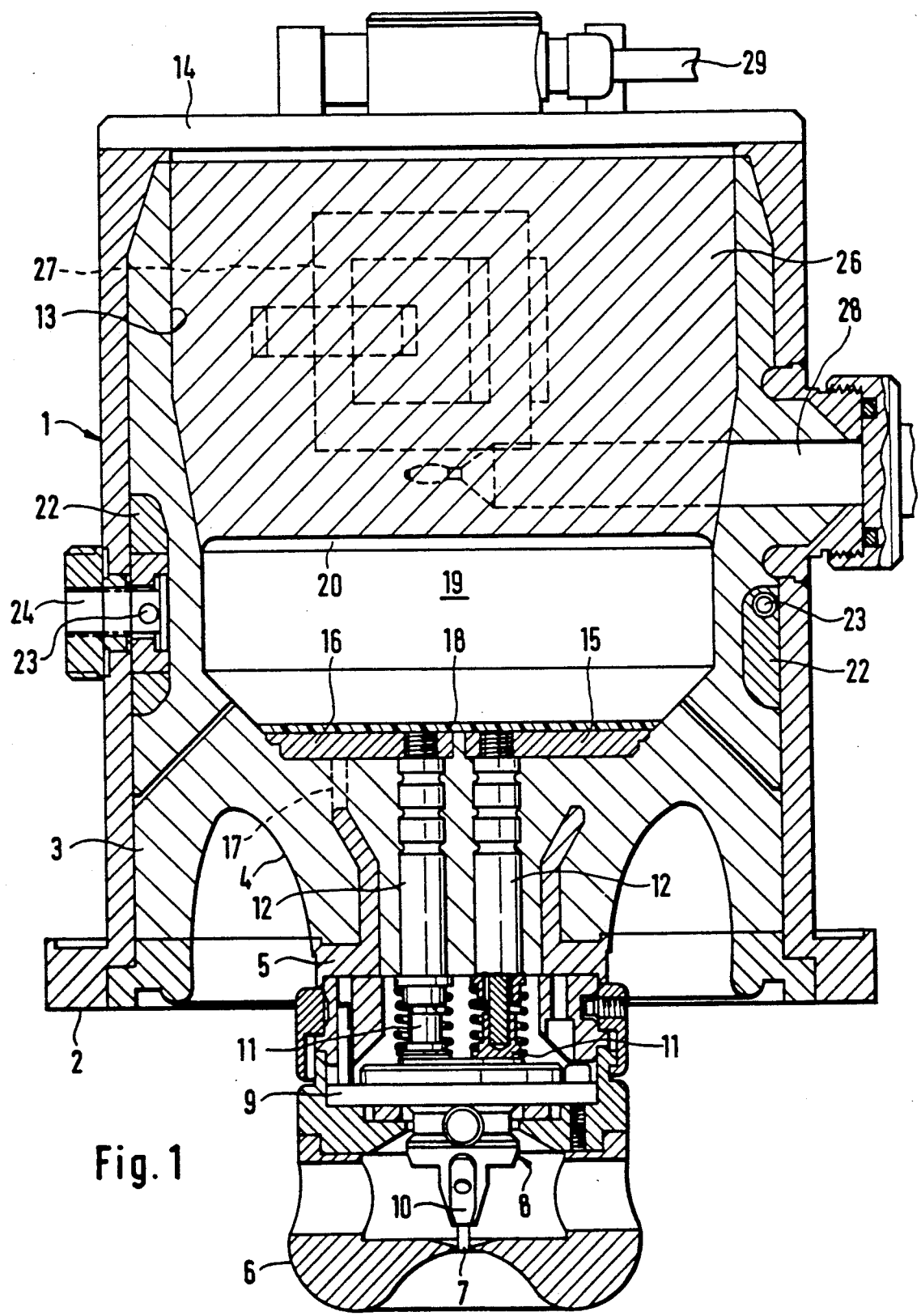
FIG. 1 is a longitudinal section through an electron beam generator in accordance with the invention for installation in an electron gun.

The electron beam generator represented consists of a cylindrical casing 1 which can be fastened hermetically with a flange 2 on an acceleration chamber, in which an accelerating anode is situated. The casing 1 contains a high-voltage insulator 3 which bears on its bottom, at the center of an annular recess 4, a control electrode 6 on a mounting flange 5, and an incandescent cathode 7. The incandescent cathode 7 is disposed on a cathode holder 8 which is mounted on an insulating support 9 in the control electrode 6. The cathode 7 is fastened to two terminals 10 of the cathode holder, each connected by a spring contact 11 in a thermally and electrically conductive manner to a conductor 12 constituted by a pin in the high-voltage insulator 3.

At its top the high-voltage insulator 3 has a central cavity 13 which is accessible through an opening in the casing 1, which can be closed by a cover 14, for the installation of various units. On the bottom of the cavity 13 are two cooling plates 15 which are separated from one another by ridges 30 on the high-voltage insulator and are affixed one to each conductor 12 by a screw thread. In the same plane with the cooling plates 15 there is provided a cooling plate 16 which can be seen in FIG. 2, and which is connected to the mounting flange 5 by a conductor 17 formed by a branch thereof. The contacts 11 and the conductors 12 and 17 consist of a metal of high thermal conductivity and thus form heat bridges carrying to the cooling plates 15 and 16 the heat transferred by the cathode to the terminals 10 and the control electrode 6.

Figure 2:
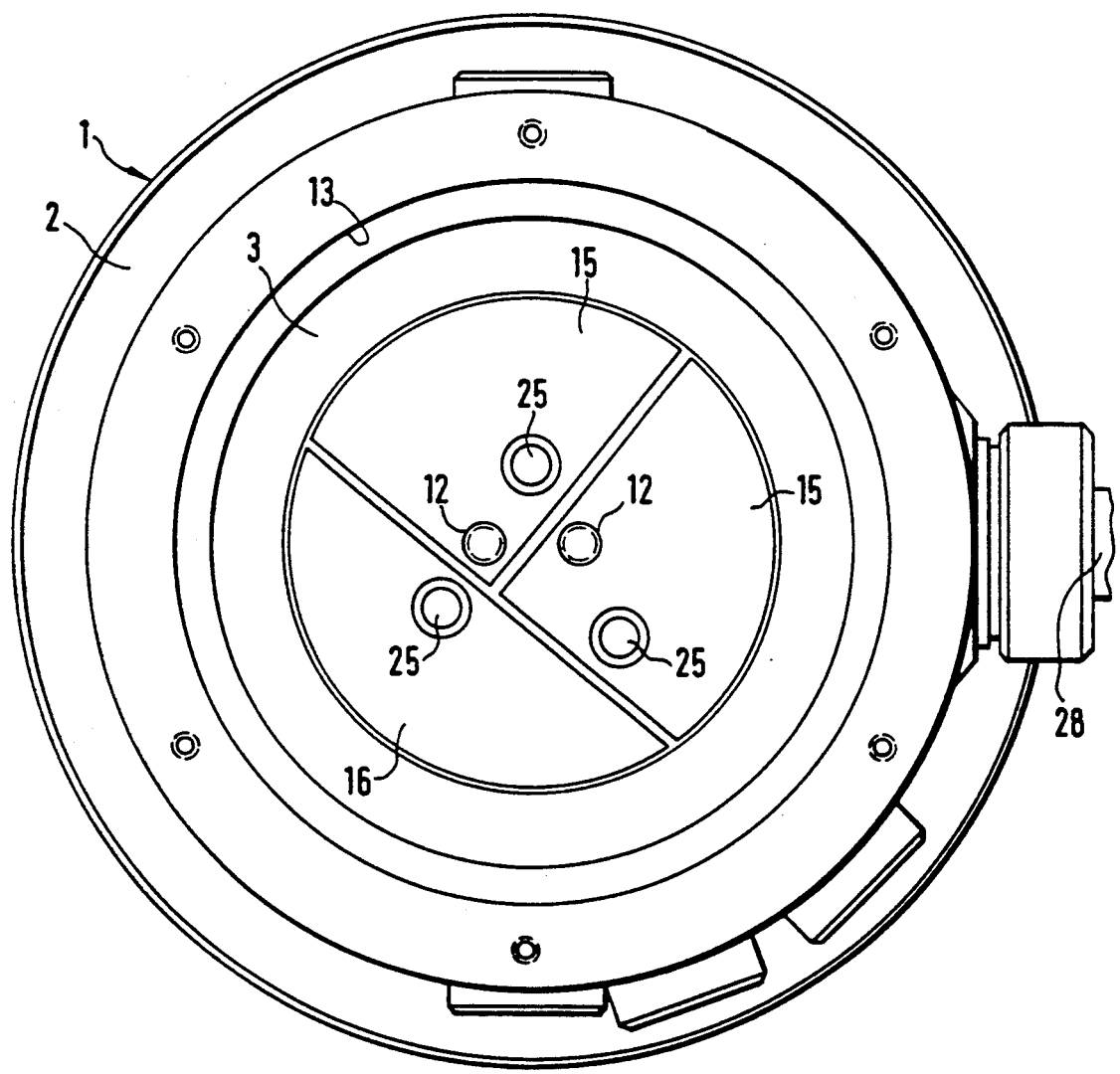
FIG. 2 is top view of the electron beam generator of FIG. 1 after the cover of the casing is removed and the components disposed over the cooling plates have been taken out.

As it can be seen in FIG. 2, the cooling plates 15 and 16 substantially cover the circular bottom surface of the cavity 13.

They are covered in turn by a circular insulator disk 18 on which the bottom of a pot-like cooling body 19 rests which completely fills the bottom part of the cavity 13. The cooling body 19 also consists of a material of good electrical and thermal conductivity and forms a capsule with a cover 20 which acts as a Faraday shield and contains an electrical circuit for controlling the electron beam generator. The cooling plates 15 and 16 are connected to the circuitry in the capsule formed by the cooling body 19 by plug contacts 25 extending through openings in the insulator disk 18 and in the bottom of the cooling body 19.

At the outer wall of the cooling body 19 the high-voltage insulator 3 has in its outer surface confronting the casing 1 an annular recess 21 containing a heat exchanger 22 having a cooling passage 23 through which a coolant runs, such as water, for example. The cooling passage 23 can be connected to a cooling circuit through an opening 24 in the casing 1.

In the upper part of the cavity 13 is an insulating body 26 which contains an isolation transformer 27 serving to produce the cathode heater current. The electron beam generator can be connected to a high-voltage power supply through a high-voltage terminal 28. An additional power connection 29 at ground potential is disposed on the cover 14 and serves to feed the primary winding of the isolation transformer 27.

The electron beam generator described above has a simple and compact structure permitting good cooling of the cathode holder 8 and control electrode 6 by an effective removal of heat through the lead-through conductors 12 in the high-voltage insulator 3 and the cooling body 19 containing the electrical circuitry. To assure a sufficiently effective heat transfer also in the portions of the insulators between the heat bridges and the cooling body, 19 and between the cooling body 19 and the heat exchanger, these portions are made as thin and broad as possible.

The heat exchanger 22 is at ground potential and therefore there are no special requirements to be met by the cooling circuit. Since the heat transfer from the beam generator to the heat exchanger is achieved exclusively by thermal conduction in solid bodies it is already effective at low temperatures, so that the temperature of the beam generator can be kept advantageously low.

We claim:

1. An electron beam generator comprising
   a cathode holder having a pair of connecting terminals (10) for a cathode,
   a cathode mounted on said holder and connected to said terminals,
   a high voltage insulator having a cavity,
   a plurality of cooling plates in said cavity,
   an electrically insulating disc disposed against said plates,
   a cooling body disposed against said electrically insulating disc,
   a coolant circuit for cooling said cooling body, said coolant circuit being disposed in said high voltage insulator adjacent to said cooling body, and
   a plurality of heat conducting bridges in said high voltage insulator for conducting heat from said connecting terminals to said cooling plates.

2. An electron beam generator as claimed in claim 1 wherein said cooling plates are coplanar and said high voltage insulator has ridges which separate said plates.

3. An electron beam generator as claimed in claim 1 wherein at least some of the heat conducting bridges comprise electrical contacts.

4. An electron beam generator as claimed in claim 1 wherein said insulating disc is a ceramic material.

5. An electron beam generator as claimed in claim 1 wherein said cooling body comprises a pot having a flat bottom surface disposed against said insulating disc and a cylindrical sidewall surrounded by said coolant circuit.

6. An electron beam generator as claimed in claim 1 wherein said cooling body comprises a material of high electrical and thermal conductivity.

7. An electron beam generator as claimed in claim 1 wherein said cooling body comprises a capsule configured as a Faraday shield in which circuitry is disposed for control of the electron beam generator.

* * * * *